United States Patent
Marchenko et al.

(10) Patent No.: US 10,552,056 B2
(45) Date of Patent: Feb. 4, 2020

(54) DATA STORAGE SYSTEM TIERING ACCOUNTING FOR LIMITED WRITE ENDURANCE

(71) Applicant: EMC IP Holding Company LLC, Hopkinton, MA (US)

(72) Inventors: Roman Vladimirovich Marchenko, Saint Petersburg (RU); Nickolay Alexandrovich Dalmatov, Saint Petersburg (RU); Alexander Valeryevich Romanyukov, Leningradskaya obl (RU)

(73) Assignee: EMC IP Holding Company LLC, Hopkinton, MA (US)

( * ) Notice: Subject to any disclaimer, the term of this patent is extended or adjusted under 35 U.S.C. 154(b) by 113 days.

(21) Appl. No.: 15/740,697

(22) PCT Filed: Dec. 28, 2016

(86) PCT No.: PCT/RU2016/000941
§ 371 (c)(1),
(2) Date: Dec. 28, 2017

(87) PCT Pub. No.: WO2018/124912
PCT Pub. Date: Jul. 5, 2018

(65) Prior Publication Data
US 2018/0321860 A1    Nov. 8, 2018

(51) Int. Cl.
*G06F 3/06*    (2006.01)
*G06F 12/02*    (2006.01)

(52) U.S. Cl.
CPC .......... *G06F 3/0616* (2013.01); *G06F 3/0649* (2013.01); *G06F 3/0685* (2013.01); *G06F 12/0223* (2013.01); *G06F 2212/1036* (2013.01); *G06F 2212/205* (2013.01)

(58) Field of Classification Search
CPC .... G06F 3/0616; G06F 3/0649; G06F 3/0685; G06F 12/0223; G06F 12/08; G11C 16/10; G11C 16/3495
See application file for complete search history.

(56) References Cited

U.S. PATENT DOCUMENTS

| | | | | |
|---|---|---|---|---|
| 8,327,103 B1 * | 12/2012 | Can | ......................... | G06F 3/061 710/39 |
| 8,380,928 B1 * | 2/2013 | Chen | ....................... | G06F 3/061 711/117 |

(Continued)

OTHER PUBLICATIONS

International Application No. PCT/RU2016/000941 Notification of Transmittal of the International Search Report and the Written Opinion of the International Searching Authority, or the Declaration; dated Sep. 21, 2017; 7 pages.

*Primary Examiner* — Ryan Bertram
(74) *Attorney, Agent, or Firm* — BainwoodHuang

(57) ABSTRACT

Techniques for performing storage tiering in a data storage system taking into account the write endurance of flash drives and the frequencies with which data are written to storage extents in a data storage system are disclosed. Such storage tiering tends to maximize data temperature of a flash tier by selecting hot extents for placement thereon, but subject to a constraint that doing so does not cause flash drives in the flash tier to operate beyond their endurance levels.

17 Claims, 4 Drawing Sheets

(56) References Cited

U.S. PATENT DOCUMENTS

| | | | |
|---|---|---|---|
| 8,566,483 B1 * | 10/2013 | Chen | G06F 3/0605 710/18 |
| 8,645,654 B1 * | 2/2014 | Bailey | G06F 3/0605 711/165 |
| 8,745,327 B1 * | 6/2014 | Throop | G06F 3/0647 711/114 |
| 9,164,692 B2 | 10/2015 | Kavuri | |
| 9,176,789 B2 | 11/2015 | Lowes et al. | |
| 9,262,449 B2 | 2/2016 | Amarendran et al. | |
| 9,274,714 B2 | 3/2016 | Kamila et al. | |
| 9,274,944 B2 | 3/2016 | Cherubini et al. | |
| 9,275,086 B2 | 3/2016 | Kumarasamy et al. | |
| 9,282,166 B2 | 3/2016 | Markley et al. | |
| 9,286,210 B2 | 3/2016 | Tanaka et al. | |
| 9,292,815 B2 | 3/2016 | Vibhor et al. | |
| 9,304,904 B2 | 4/2016 | Smith et al. | |
| 9,304,905 B2 | 4/2016 | Kwon et al. | |
| 9,329,991 B2 | 5/2016 | Cohen et al. | |
| 9,342,260 B2 | 5/2016 | Schuette et al. | |
| 9,342,537 B2 | 5/2016 | Kumarasamy et al. | |
| 9,361,987 B2 | 6/2016 | Cornwell et al. | |
| 9,372,790 B2 | 6/2016 | Lee et al. | |
| 9,747,057 B1 * | 8/2017 | Ramani | G06F 3/0652 |
| 9,959,058 B1 | 5/2018 | O'Brien et al. | |
| 10,067,840 B1 * | 9/2018 | Labaj | G06F 11/1076 |
| 2013/0145077 A1 * | 6/2013 | Huang | G06F 11/008 711/103 |
| 2013/0346672 A1 * | 12/2013 | Sengupta | G06F 12/0871 711/103 |
| 2016/0320980 A1 | 11/2016 | Fang et al. | |
| 2016/0328179 A1 | 11/2016 | Quinn | |
| 2017/0371583 A1 * | 12/2017 | Algie | G06F 3/067 |

\* cited by examiner

DATA STORAGE SYSTEM TIERING ACCOUNTING FOR LIMITED WRITE ENDURANCE

BACKGROUND

Data storage systems are arrangements of hardware and software that include storage processors coupled to arrays of non-volatile storage devices, such as magnetic disk drives, electronic flash drives, and/or optical drives, for example. The storage processors service storage requests, arriving from host machines ("hosts"), which specify files or other data elements to be written, read, created, deleted, and so forth. Software running on the storage processors manages incoming storage requests and performs various data processing tasks to organize and secure the data elements stored on the non-volatile storage devices.

Data storage systems commonly arrange non-volatile storage devices in different classes, or "tiers," where each tier includes many storage drives of like kind. For example, a data storage system may include one or more flash tiers, which include flash drives that provide high-speed storage at high cost, and one or more magnetic tiers, which include magnetic disk drives that provide high capacity storage at lower cost, as well as lower speed.

Some data storage systems include software programs for performing automatic storage tiering. Such programs monitor storage elements to determine their "data temperatures," i.e., the frequencies at which they are read and/or written, and move data between or among storage tiers to better utilize storage resources overall. For example, an automatic storage tiering program may identify "hot" data, i.e., data which is accessed frequently and thus has high data temperature. If the hot data has been placed on a magnetic storage tier, the program may move the data to a flash storage tier, so that the hot data can be accessed more quickly. Likewise, the program may identify "cold" data, which has low data temperature. If the cold data has been placed on a flash storage tier, the program may move the cold data to a magnetic storage tier, such that the flash storage occupied by the cold data is made available for receiving more hot data.

SUMMARY

Unfortunately, prior approaches to automatic storage tiering can accelerate wear in flash drives and can contribute to their early failure. For example, prior tiering solutions address data in increments of storage, such as slices, where a "slice" is a contiguous extent of addressable storage. Such prior solutions may map a "hot" extent of storage to a slice residing on a flash tier. However, flash drives have a known failure mechanism by which they degrade at a microscopic level in response to being written. Thus, assigning overly write-intensive slices to flash tiers may prematurely age flash drives and cause them to fail much sooner than they otherwise might.

In contrast with prior tiering solutions, which may contribute to early failure of flash drives, an improved technique performs storage tiering by taking into account the write endurance of flash drives and the frequencies with which data are written to storage extents in a data storage system. Such storage tiering tends to maximize data temperature of a flash tier by selecting hot extents for placement thereon, but subject to a constraint that doing so does not cause flash drives in the flash tier to operate beyond their endurance levels.

In some examples, a data storage system generates new tiering configurations using a precise tiering method that identifies an optimal tiering solution. This precise approach predicts a tier temperature of the flash tier for every possible permutation of extent placement in the flash tier. The precise approach then selects a configuration that maximizes overall temperature of the flash tier subject to the constraint that the resulting tier write frequency does not exceed a maximum write rate based on endurance.

In other examples, the data storage system generates new tiering configurations using an approximate but computationally efficient approach that applies heuristics to find configurations of extent data on the flash tier that increase tier temperature while staying within the maximum write rate.

In some examples, both the precise tiering calculation and the approximate tiering calculation may be provided, with the data storage system selecting between them based on available computational resources in the data storage system. In some examples, the selection between the two calculations is based on a ratio of a number of storage extents in the flash tier to a number of storage extents of active data in the data storage system.

Certain embodiments are directed to a method of storing data in a data storage system having multiple storage tiers, each storage tier composed of multiple storage drives of like performance. The method includes: rendering storage space in each of the storage tiers as multiple slices, each slice providing an extent of contiguously addressable storage derived from a single storage tier.

The method further includes receiving write-endurance levels from a set of storage drives in a first storage tier, each write-endurance level from a storage drive indicating a number of writes that can be performed within a service life of the respective storage drive.

The method further includes calculating a maximum write rate of the first storage tier based on the write-endurance levels received from the set of storage drives in the first storage tier and measuring, for each slice in the first storage tier, (i) a slice temperature that indicates a rate of IO (Input/Output) access to data on that slice and (ii) a slice write frequency that indicates a rate at which data is written to that slice.

The method further includes relocating slice data between storage tiers based on (i) the slice temperatures, (ii) the slice write frequencies, and (iii) the maximum write rate of the first storage tier.

Other embodiments are directed to a data storage system constructed and arranged to perform a method of storing data in a data storage system having multiple storage tiers, such as the method described above. Still other embodiments are directed to a computer program product. The computer program product stores instructions which, when executed on control circuitry of a data storage system, cause the data storage system to perform a method of storing data in multiple storage tiers, such as the method described above.

The foregoing summary is presented for illustrative purposes to assist the reader in readily grasping example features presented herein; however, the foregoing summary is not intended to set forth required elements or to limit embodiments hereof in any way. One should appreciate that the above-described features can be combined in any manner that makes technological sense, and that all such combinations are intended to be disclosed herein, regardless of whether such combinations are identified explicitly or not.

BRIEF DESCRIPTION OF THE SEVERAL VIEWS OF THE DRAWINGS

The foregoing and other features and advantages will be apparent from the following description of particular embodiments of the invention, as illustrated in the accompanying drawings, in which like reference characters refer to the same or similar parts throughout the different views.

The drawings are not necessarily to scale, emphasis instead being placed upon illustrating the principles of various embodiments.

DETAILED DESCRIPTION OF THE INVENTION

Embodiments of the invention will now be described. It should be appreciated that such embodiments are provided by way of example to illustrate certain features and principles of the invention but that the invention hereof is not limited to the particular embodiments described.

An improved technique for performing storage tiering in a data storage system takes into account the write endurance of flash drives and the frequencies with which data are written to storage extents in a data storage system. Such storage tiering tends to maximize data temperature of a flash tier by selecting hot extents for placement thereon, but subject to a constraint that doing so does not cause flash drives in the flash tier to operate beyond their endurance levels.

Figure 1:
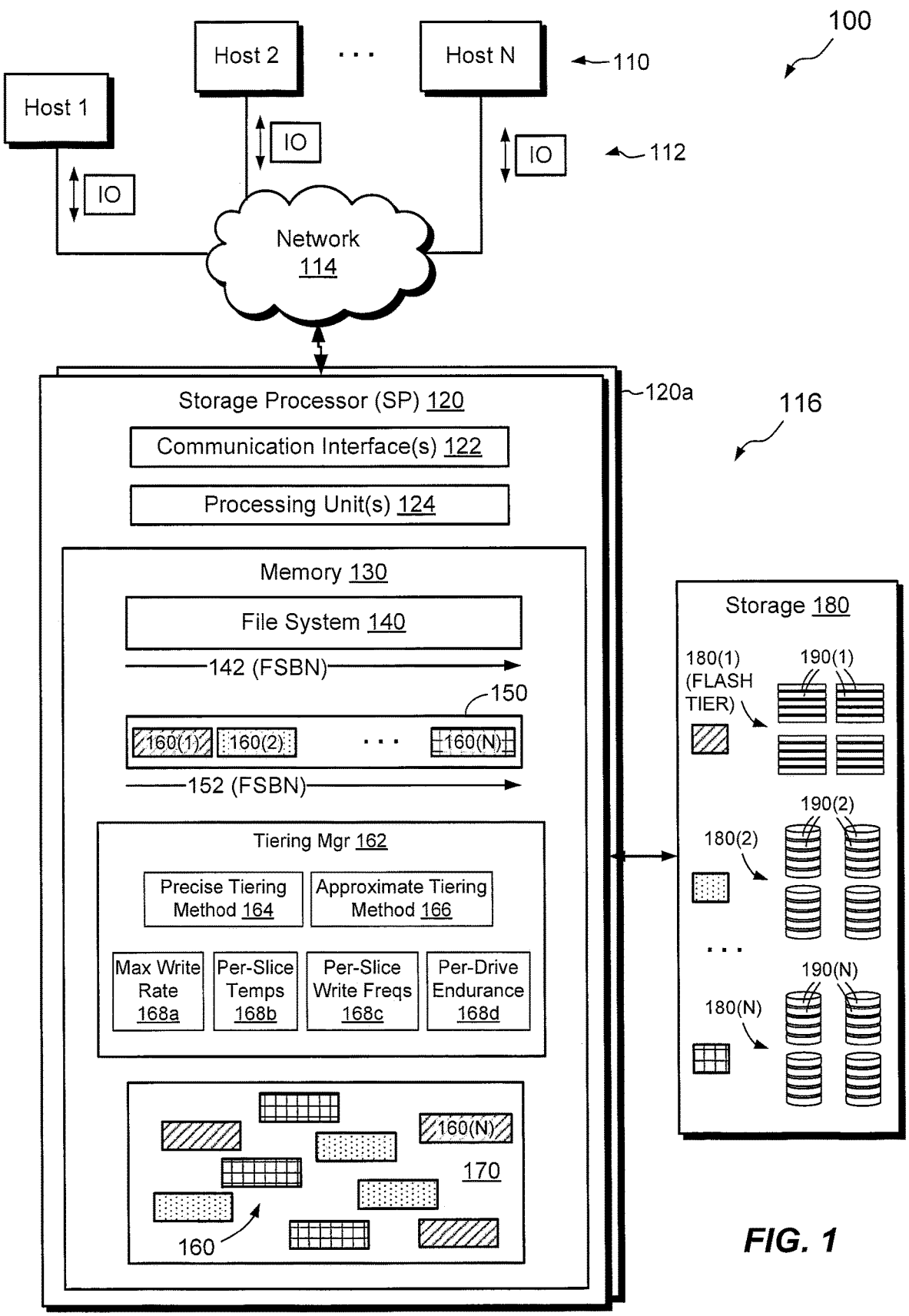
FIG. 1 is a block diagram of an example environment in which embodiments of the improved technique hereof can be practiced.

FIG. 1 shows an example environment 100 in which embodiments of the improved technique hereof can be practiced. Here, multiple host computing devices ("hosts") 110 access a data storage system 116 over a network 114. The data storage system 116 includes a storage processor, or "SP," 120 and storage 180. The storage 180 includes multiple storage drives 190 of different types arranged in respective storage tiers 180(1) through 180(N). For example, a first tier 180(1) includes multiple flash drives 190(1), a second tier 180(2) includes multiple magnetic disk drives. These particular storage tiers 180(1) through 180(N) are merely examples. Alternative arrangements may include multiple tiers for respective levels of flash storage, tiers for other types of magnetic disk drives, tiers for optical drives, tiers for tape drives, and the like. In some examples, storage drives in storage 180 are arranged in RAID (Redundant Array of Independent Disks) groups. In such arrangements, the SP 120 may treat each RAID group in storage 180 as a single logical disk drive.

The data storage system 116 may include multiple SPs like the SP 120 (e.g., a second SP 120a). In an example, multiple SPs may be provided as circuit board assemblies, or "blades," which plug into a chassis that encloses and cools the SPs. The chassis has a backplane for interconnecting the SPs, and additional connections may be made among SPs using cables. It is understood, however, that no particular hardware configuration is required, as any number of SPs may be provided, including a single SP, and the SP 120 may be any type of computing device capable of processing host IOs.

The network 114 may be any type of network or combination of networks, such as a storage area network (SAN), a local area network (LAN), a wide area network (WAN), the Internet, and/or some other type of network or combination of networks, for example. The hosts 110 may connect to the SP 120 using various technologies, such as Fibre Channel, iSCSI, NFS, and CIFS, for example. Any number of hosts 110 may be provided, using any of the above protocols, some subset thereof, or other protocols besides those shown. As is known, Fibre Channel and iSCSI are block-based protocols, whereas NFS and CIFS are file-based protocols. The SP 120 is configured to receive IO requests 112 according to block-based and/or file-based protocols and to respond to such IO requests 112 by reading or writing the storage 180.

The SP 120 includes one or more communication interfaces 122, a set of processing units 124, and memory 130. The communication interfaces 122 include, for example, SCSI target adapters and network interface adapters for converting electronic and/or optical signals received over the network 114 to electronic form for use by the SP 120. The set of processing units 124 includes one or more processing chips and/or assemblies. In a particular example, the set of processing units 124 includes numerous multi-core CPUs (Central Processing Units). The memory 130 includes both volatile memory, such as random access memory, and non-volatile memory, such as one or more read-only memories, disk drives, solid state drives, and the like. The set of processing units 124 and the memory 130 together form control circuitry, which is constructed and arranged to carry out various methods and functions as described herein. Also, the memory 130 includes a variety of software constructs realized in the form of executable instructions. When the executable instructions are run by the set of processing units 124, the set of processing units 124 are caused to carry out the operations of the software constructs. Although certain software constructs are specifically shown and described, it is understood that the memory 130 typically includes many other software constructs, which are not shown, such as an operating system, various applications, processes, and daemons.

As further shown in FIG. 1, the memory 130 "includes," i.e., realizes with data and by operation of software instructions, a file system 140, allocation metadata 144, a storage space 150, such as a volume, a tiering manager 162, and a storage pool 170. The file system 140 has a physical address space 142, denominated in blocks, where a "block" is the smallest unit of storage that may be allocated in the file system 140. In an example, the physical address space 142 ranges from zero to some large number. Each address in the physical address space 142 uniquely identifies a block by its file system block number, or "FSBN." Blocks may be provided in uniformly-sized units, which may be 4 KB or 8 KB, for example. Some instances of file system 140 may support multiple block sizes, such as one block size for file data and another block size for file metadata. One should appreciate that the inclusion of file system 140 and storage (e.g., volume) 150 are merely examples of storage objects to which storage tiering may be applied and are shown herein merely for illustration.

File system 140 is built upon a storage space 150. This storage space 150 has a physical address space 152, which corresponds block-for-block with the physical address space 142 of the file system 140. The storage space 150 is provisioned with storage extents, such as slices 160. Each slice 160 is a contiguous range of storage derived from a particular storage tier. In an example, each slice may be derived from a single RAID group of a single storage tier, e.g., as a stripe or set of stripes across that RAID group. Slices 160 are preferably uniform in size, such as 256 MB or 1 GB, for example. In the example shown, certain ranges of address space 152 are provisioned with slices 160 but other ranges are empty.

Slices 160 reside in a storage pool 170, which may provision slices 160 to the storage space 150, e.g., on demand as storage space 150 requires more storage space. The storage pool 170 may also reclaim provisioned slices that are no longer required. In the example shown, storage pool 170 includes multiple slices 160(1), 160(2) and 160(N) derived from each of the respective storage tiers 180(1), 180(2), and 180(N), with slices from each storage tier shown with respective shading patterns. In some examples, the same storage pool 170 supports multiple volumes and corresponding file systems. In addition, the SP 120 may operate multiple storage pools.

In a typical arrangement, storage space 150 includes hundreds or thousands of slices, only four of which are shown for simplicity. Slice 160(1) is derived from the first tier 180(1), slice 160(2) is derived from tier 180(2), and slice 160(N) is derived from tier 180(N).

In example operation, hosts 110 issue IO requests 112 to the data storage system 116 to request reads and writes of one or more data objects stored in the data storage system 116, such as in file system 140. SP 120 receives the IO requests 112 at communication interface(s) 122 and passes them to memory 130 for further processing.

As IO requests 112 arrive, the tiering manager 162 monitors the IO requests 112 directed to each provisioned slice (e.g., to each of slices 160(1) through 160(N) in the storage space 150) and generates a data temperature for each provisioned slice as well as monitoring the rate of write requests for each slice. Some slices may be hot, indicating a high degree of IO activity, whereas other slices may be cold, indicating a low degree of IO activity. After monitoring IO activity for a period of time, the tiering manager 162 may initiate automatic storage tiering. Such automatic storage tiering may run in the background on SP 120, out of band with IO requests 112, and in accordance with one or more tiering policies, such as a precise tiering method 164 or an approximate tiering method 166.

The tiering manager 162 receives the following inputs: a maximum write rate 168a for tier 180(1), set of per-slice temperatures 168b, a set of per-slice write frequencies 168c, and a set of per-drive endurance values 168d. In an example, maximum write rate 168a represents a maximum rate at which data may be written to flash tier 180(1) and is derived, for example, from data collected from drives 190(1) in flash tier 180(1) (e.g., endurance data and, in some cases, usage data), as described below in connection with FIG. 3. The per-slice data temperatures 168b specify a data temperature associated with each slice, e.g., for all slices across all tiers. The per-slice write frequencies 168c specify a current rate (e.g., a recent moving average) at which data is written to each slice, again, for example, for all slices across all tiers. Values 168a, 168b, and 160c are based upon data collected by SP 120 in the course of responding to IO requests 112, as described above. Values of 168d are based upon polling of flash drives in flash tier 180(1), which may take place on any suitable schedule, such as daily, weekly, monthly, etc., and preferably any time there is a change in the constituents of the tier 180(1), e.g., in response to a flash drive being added, removed, replaced, etc.

Using these inputs, either the precise tiering method 164 or the approximate tiering method 166 may be performed, resulting in relocation of hot data to flash tier 180(1), subject to constraints as discussed further below in connection with FIG. 2. As hot data are relocated to flash tier 180(1), cooler data may relocated to other tiers 180(2) through 180(N), e.g., to make room for the hotter data.

Figure 2:
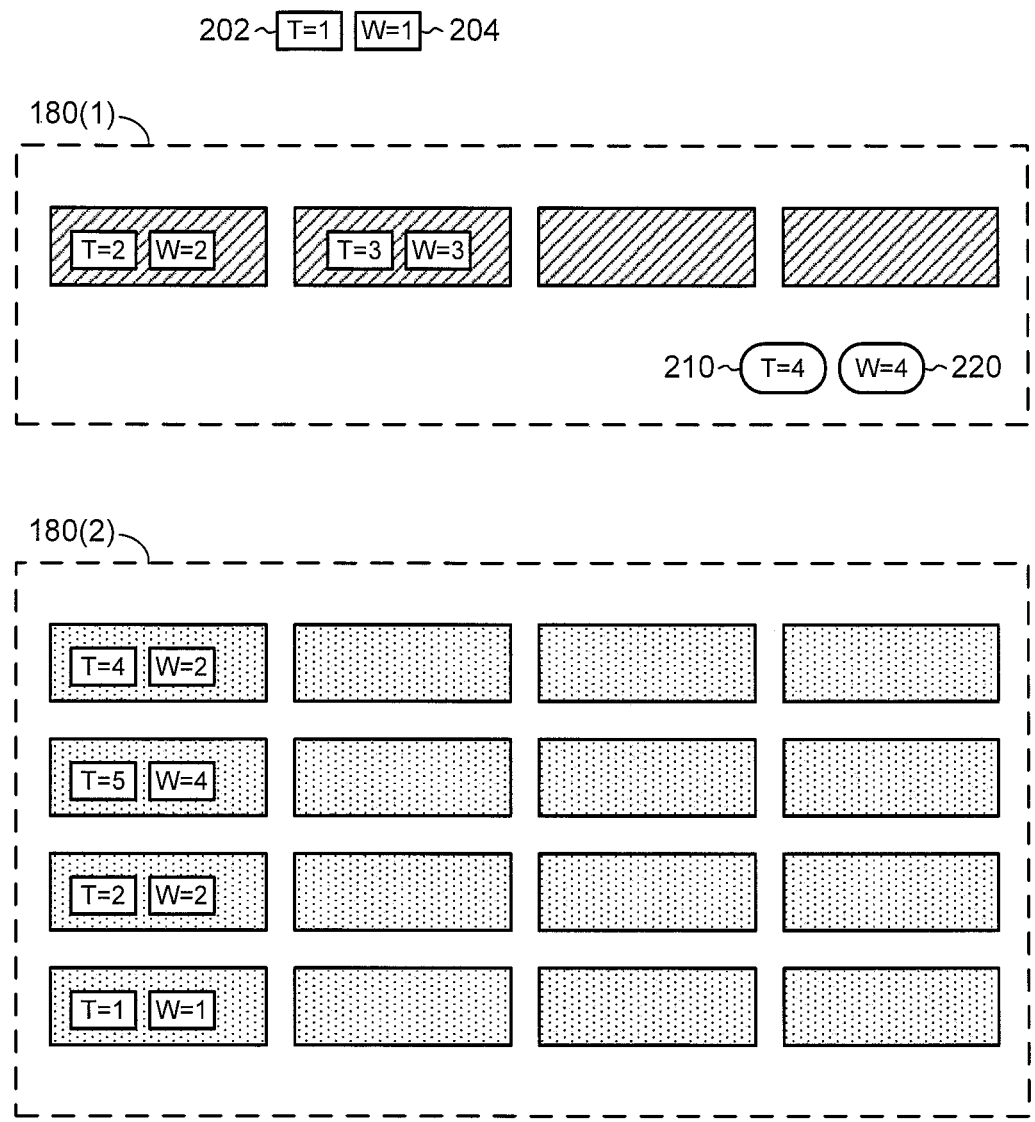
FIG. 2 is a block diagram schematic of an example configuration of components of the system in FIG. 1.

FIG. 2 shows an example configuration of slices 160 in storage tiers 180(1) and 180(2). Also shown are slice temperature 202 and slice write rate 204. Active slices (i.e., those are provisioned from the storage pool 170) are labeled with an associated slice temperature ('T') 202 and slice write rate ('W') 204. The slices belonging to tiers 180(1) and 180(2) are shown using the same shading patterns as in FIG. 1. In this example, there are four slices that belong to storage tier 180(1) and sixteen slices that belong to storage tier 180(2). Tier 180(1) has an associated tier temperature 210 and an associated tier write rate 220. Tier temperature 210 is a sum (or average) of temperatures 202 across all slices 160 in the flash tier 180(1), whereas tier write rate 220 is the average of write frequencies 204 across all slices 160 in the flash tier. In this example, larger values indicate higher temperatures and write rates, respectively. Each write frequency 204 may be expressed as a quantity of data written to the corresponding slice in one day, for example, such as 20 gigabytes/day or 1 terabyte/day. Although tier temperature 210 and tier write rate 220 are shown only for flash tier 180(1), one should appreciate that other storage tiers may also have associated tier temperatures and tier write rates. For instance, the techniques disclosed herein for optimizing storage of hot data in the flash tier 180(1) subject to endurance constraints may also be applied to other storage tiers, e.g., other flash tiers or other types of tiers for which endurance may be relevant.

The arrangement of FIG. 2 is for the purpose of illustration. For example, there can be any number of slices belonging to each of storage tiers 180(1) and 180(2). Further, quantities such as temperature or write frequency may be expressed in any convenient units.

The configuration shown in FIG. 2 may not be optimal. In this case, tiering manager 162 may produce an improved configuration by applying either precise tiering method 164 or approximate tiering method 166. It will be appreciated by one skilled in the art that computational approaches to solving the well-known "knapsack" problem may be helpful in implementing the precise tiering method in some arrangements.

Precise tiering method 164 predicts tier temperatures for acceptable configurations of slice data stored in slices 160 on storage tier 180(1). Only configurations for which the tier write rate 220 does not exceed the maximum write rate 168a are acceptable. As discussed below in connection with FIG. 3, the maximum write rate 168a for tier 180(1) can be calculated as an average of endurance values (e.g., measured in drive writes per day) across all drives 190(1) in that tier.

Precise tiering method 164 then selects a configuration that provides the maximum tier temperature 210 subject to the constraint that the resulting tier write frequency 220 does not exceed the maximum write rate 168a. To illustrate, suppose, as an example, that the maximum write rate 168a for tier 180(1) is equal to 5. In this case, the precise tiering method 164 may calculate the tier temperature 210 of tier 180(1) for all possible configurations of slice data placement on tier 180(1). The precise tiering method 164 may then select the configuration that gives the maximum tier temperature 210 subject to the constraint that the tier write rate 220 predicted for that configuration does not exceed the maximum write rate 168a, i.e., 5. The order of activities can be varied in some examples. For instance, the precise tiering method 164 may first calculate tier write rates 220 across all possible configurations of slice data placement on tier 180(1), eliminate any configurations that produce tier temperatures 210 that exceed the maximum tier temperature 164a, and then select the configuration that gives the highest tier temperature from the configurations that remain. For ease of discussion, the combination of a slice temperature 202 and a slice write frequency 204 for a single slice 160 is denoted herein by a pair of values in brackets, e.g., [1, 2], where the first value is the slice temperature 202 and the second value is the slice write frequency 204. While it should be understood that temperatures and write frequencies may be best expressed in particular units, units are omitted herein for simplicity.

As shown in FIG. 2, tier 180(1) has four slices worth of capacity and two slices that are actively storing data. Those slices have values [2, 2] and [3,3]. Thus, the tier temperature 210 is 5 (2+3) and the tier write rate 220 is also 5. Tier 180(2) has sixteen slices worth of capacity and four slices are actively storing data with values of [4,2], [5,4], [2,2], and [1,1]. The tier temperature 210 of tier 180(1) could be maximized by populating it with data from the five hottest slices. Such a configuration would have values [5,4], [4,2], [3, 3], and [2, 2]. If implemented on tier 180(1), this configuration would have a tier temperature 210 of 14 (5+4+3+2). However, the tier write rate 220 would be equal to 11, which is greater than the specified maximum write rate 168a (5 in this example).

The greatest tier temperature 210 possible given the constraint that the tier write rate 220 must not exceed 5 for the slices shown in FIG. 2 is 7. It is possible to achieve this tier temperature 210 by more than one configuration of slice data. For instance, moving slice data between the tiers so that the new configuration on tier 180(1) has values [4, 2] and [3, 3] yields the desired value of 7 for the tier temperature 210 and results in a tier write rate 210 equal to the maximum write rate 168a (i.e., 5). A configuration with the values [4, 2], [2, 2] and [1, 1] is also suitable and results in the same values. It should be noted that neither of these configurations results in filling all the available capacity of tier 180(1).

One skilled in the art will appreciate that, in some arrangements, precise tiering method 164 may apply additional constraints on the implemented arrangement of data on tier 180(1). For instance, if there are multiple suitable configurations which maximize the tier temperature 210, it may be desirable to choose a configuration that maximizes the available capacity remaining on tier 180(1). Alternatively, it may be desirable in such situations to minimize the tier write rate 220. One skilled in the art will understand that there are many possible additional constraints which may be chosen in different situations.

If there are numerous possible permutations of slice data, it may be computationally expensive to perform the precise tiering method. Tiering manager 162 can estimate the computational resources (e.g., available memory and/or processor cycles) required to perform the precise tiering method within a user-determined time limit. If the available resources are insufficient, either because the data storage system does not have the necessary resources, or because some of the system resources are busy responding to IO requests 112, tiering manager 162 may perform approximate tiering method 166 instead of precise tiering method 164.

In some arrangements, a ratio of the capacity of storage tier 180(1) (measured in slices) to the total number of active slices storing data in the system can provide a useful threshold for determining whether performing the exact tiering method 164 is feasible. In such arrangements, the tiering manager 162 uses the precise tiering method 164 when the ratio is less than a threshold (e.g., 0.5) and uses the approximate tiering method 166 when the ratio is less than or equal to the threshold.

Approximate tiering method 166 can use a wide array of heuristic approaches to find configurations of slice data on tier 180(1) which increase the tier temperature 210 as desired while keeping the tier write rate 220 from exceeding the maximum write rate 168a. Various "greedy" methods are one such class of approaches. In a greedy method, one slice's worth of data is chosen at a time to reside on tier 180(1) and data from a slice with a highest value of some parameter is always chosen first, followed by the slice with the next highest value. The simplest example is selecting data from the slice with the highest slice temperature 202 and continuing to choose slices with the highest temperature until tier 180(1) is full or the predicted tier write rate 220 exceeds the maximum write rate 168a. Alternatively, another greedy method might choose data from slices with the highest value for a ratio of slice temperature 202 to slice write frequency 204.

Figure 3:
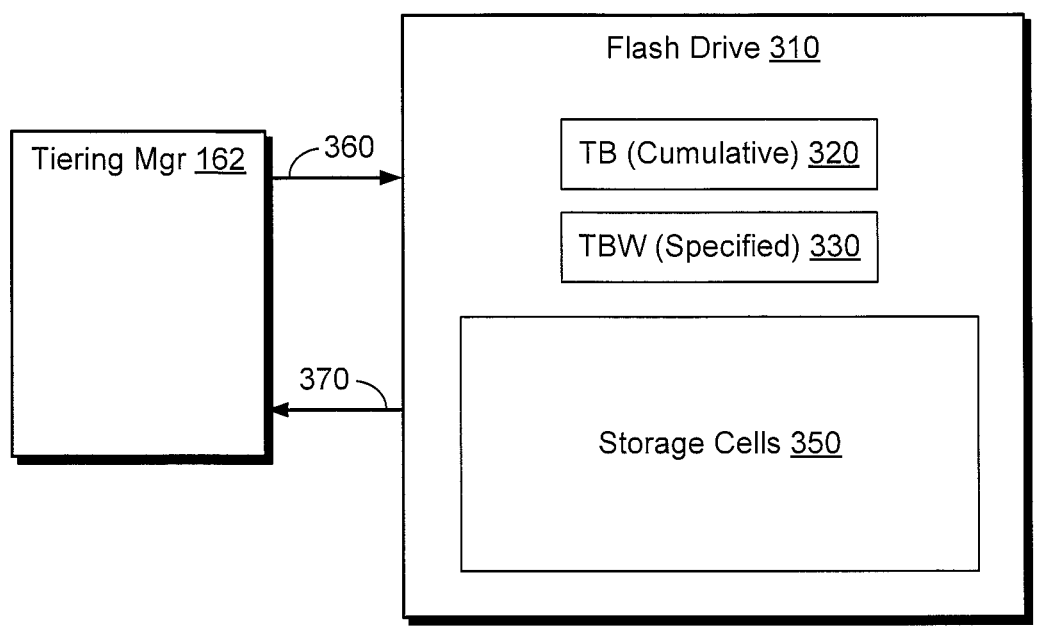
FIG. 3 is a block diagram showing a more detailed view of components shown in FIG. 1.

FIG. 3 shows an example interaction between the tiering manager 162 and a flash drive 310, which may be representative of any flash drive in the flash tier 180(1). Here, flash drive 310 includes registers 320 and 330, as well as storage cells 350 for storing bulk data. Register 320 stores a cumulative amount of data already written to the flash drive 310 and may be expressed in units of terabytes (TB). Register 330 stores a manufacturer's specification for endurance of the flash drive 310, where "endurance" is a total amount of data that may be written to the storage cells 350 in the flash drive 310 within its manufacturer's warranty. For example, writing more data than the endurance specification provides may void the warranty on the flash drive 410. The flash drive 410 may express endurance as TBW (Terabytes Written), where the number stored in register 430 provides the total number of terabytes that may be written to the drive within its warranty. With this arrangement, the difference between TBW (from register 330) and TB (from register 320) may represent a remaining volume of writes that may be performed in flash drive 410 within warranty. Register 330 may alternatively express endurance as DWPD (Drive Writes Per Day), which is equivalent to TBW divided by the product a the capacity of the drive and the total number of days in the drive's warranty period. For example, a flash drive with a TBW of 1,000, a capacity of 1 TB, and a warrantied service life of 5 years would have a DWPD of 1,000 TB/(1 TB*365.25 days*5 years), or approximately 1.8. This means that one could rewrite the entire contents of the flash drive 1.8 times per day for 5 years without exceeding warranty.

Along these lines, the maximum tier write rate 168a for tier 180(1) can be calculated as a weighted average of the DWPD rates of all drives 190(1) in that tier (with weighting for each drive established based on the total storage capacity of that drive) or as a direct sum of the values of TBW, or of (TBW-TB), as discussed above. In some examples, DWPD may be expressed on a per-slice basis, where each slice has a DWPD equal to the DWPD of the flash drive from which it is derived. Where a slice 160 is derived from a RAID group, the DWPD of that slice may be the DWPD of the weakest flash drive in the RAID group, i.e., the flash drive having the lowest endurance as measured in DWPD. Tier write rate 168a may then be expressed as an average of the DWPD's across all slices in the tier.

In an example, the tiering manager 162 sends a query 360 to flash drive 310 to obtain the contents of registers 320 and 330. In response to the query 360, the flash drive 310 returns a query response 370 that provides the requested contents. Tiering manager 362 may maintain an internal database of such values for all flash drives in the flash tier 180(1), and may requery each flash drive for updated values of TB (from registers 320) on a regular basis, such as daily, weekly, etc. The tiering manager 162 may then apply its database of flash endurance and/or usage information in making tiering decisions. For example, the precise tiering policy 164 and approximate tiering policy 166 may specify rules for performing storage tiering based on the endurance of particular drives and/or on the usage of such drives.

In some embodiments, the tiering manager 162 may detect that an individual drive in the flash tier has been operating in excess of its endurance level. Such excursions may be detected by querying a flash drive 310 for the contents of registers 320, as described above, and will result in an increase in the tier write rate 220. If that increase would cause the tier write rate 220 to exceed the maximum write rate 168a, a subsequent tiering operation may relocate high write-rate data to a lower tier, i.e., to ensure that the flash drives in the flash tier stay within their endurance limits.

It should further be appreciated that some flash drives may be provided without defined endurance specifications. Such drives nevertheless have endurance levels, which may be estimated by a data storage system manufacturer and/or administrator and may be used herein to assist in performing storage tiering.

Figure 4:
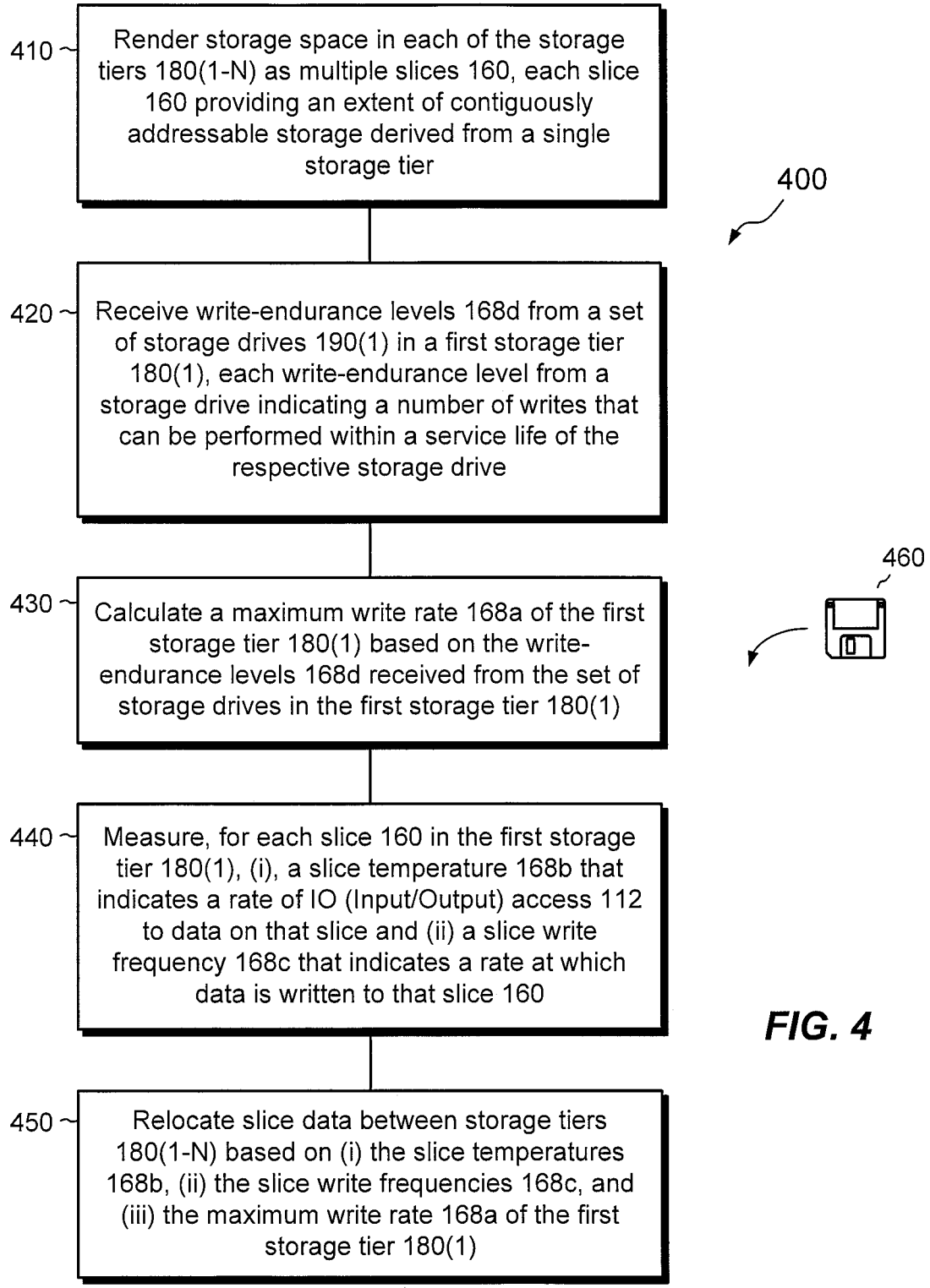
FIG. 4 is a flowchart showing an example method of storing data in a data storage system having multiple storage tiers in the environment of FIG. 1.

FIG. 4 shows an example method 400 of a method of storing data in a data storage system having multiple storage tiers. The method 400 may be carried out, for example, by the tiering manager 162, which resides in the memory 130 of the storage processor 120 and is run by the processing units 124. The method 400 contains acts 410, 420, 430, 440, and 450.

At 410, the method renders storage space in each of the storage tiers 180(1-N) as multiple slices 160, each slice 160 providing an extent of contiguously addressable storage derived from a single storage tier.

At 420, the method receives write-endurance levels 168d from a set of storage drives 190(1) in a first storage tier 180(1), each write-endurance level from a storage drive indicating a number of writes that can be performed within a service life of the respective storage drive.

At 430, the method calculates a maximum write rate 168a of the first storage tier 180(1) based on the write-endurance levels 168d received from the set of storage drives in the first storage tier 180(1), as described above.

At 440, the method measures, for each slice 160 in the first storage tier 180(1), (i), a slice temperature 168b that indicates a rate of IO (Input/Output) access 112 to data on that slice and (ii) a slice write frequency 168c that indicates a rate at which data is written to that slice 160.

At 450, the method relocates slice data between storage tiers 180(1-N) based on (i) the slice temperatures 168b, (ii) the slice write frequencies 168c, and (iii) the maximum write rate 168a of the first storage tier 180(1).

The method 400 is typically performed, for example, by the software constructs described in connection with FIG. 1, which reside in the memory 130 of the storage processor 120 and are run by the set of processors 124. The various acts of method 400 may be ordered in any suitable way. Accordingly, embodiments may be constructed in which acts are performed in orders different from that illustrated, which may include performing some acts simultaneously.

Having described certain embodiments, numerous alternative embodiments or variations can be made. For example, tier 180(1) may be composed of sub-tiers arranged by write endurance such that each sub-tier includes storage drives of like write endurance and storage drives in different sub-tiers have different write endurance. In such embodiments, each sub-tier has a respective maximum write rate based on write-endurance levels received from storage drives in that sub-tier. In such embodiments, the method further includes moving slice data between sub-tiers based on (i) the slice write frequencies in the first storage tier, and (ii) the maximum write rates of the sub-tiers when relocating data.

In other embodiments, the maximum write rate for flash tiers may be temporarily or permanently lowered in response to detecting that a flash tier has exceeded its predicted tier write rate, resulting in exceeding the maximum write rate for the tier.

In other embodiments, the data storage system may include combinations of flash and/or alternate storage technologies with write endurance limitations. Such technologies might include, but are not limited to, resistive random-access memory and phase-change memory.

Further, although features are shown and described with reference to particular embodiments hereof, such features may be included and hereby are included in any of the disclosed embodiments and their variants. Thus, it is understood that features disclosed in connection with any embodiment are included as variants of any other embodiment.

Further still, the improvement or portions thereof may be embodied as a computer program product including one or more non-transient, computer-readable storage media, such as a magnetic disk, magnetic tape, compact disk, DVD, optical disk, flash drive, solid state drive, SD (Secure Digital) chip or device, Application Specific Integrated Circuit (ASIC), Field Programmable Gate Array (FPGA), and/or the like (shown by way of example as medium 460 in FIG. 4). Any number of computer-readable media may be used. The media may be encoded with instructions which, when executed on one or more computers or other processors, perform the process or processes described herein. Such media may be considered articles of manufacture or machines, and may be transportable from one machine to another.

As used throughout this document, the words "comprising," "including," "containing," and "having" are intended to set forth certain items, steps, elements, or aspects of something in an open-ended fashion. Also, as used herein and unless a specific statement is made to the contrary, the word "set" means one or more of something. This is the case regardless of whether the phrase "set of" is followed by a singular or plural object and regardless of whether it is conjugated with a singular or plural verb. Further, although ordinal expressions, such as "first," "second," "third," and so on, may be used as adjectives herein, such ordinal expressions are used for identification purposes and, unless specifically indicated, are not intended to imply any ordering or sequence. Thus, for example, a "second" event may take place before or after a "first event," or even if no first event ever occurs. In addition, an identification herein of a particular element, feature, or act as being a "first" such element, feature, or act should not be construed as requiring that there must also be a "second" or other such element, feature or act. Rather, the "first" item may be the only one. Although certain embodiments are disclosed herein, it is understood that these are provided by way of example only and that the invention is not limited to these particular embodiments.

Those skilled in the art will therefore understand that various changes in form and detail may be made to the embodiments disclosed herein without departing from the scope of the invention.

What is claimed is:

1. A method of storing data in a data storage system having multiple storage tiers, each storage tier composed of multiple storage drives of like performance, the method comprising:
   rendering storage space in each of the storage tiers as multiple slices, each slice providing an extent of contiguously addressable storage derived from a single storage tier;
   receiving write-endurance levels from a set of storage drives in a first storage tier, each write-endurance level from a storage drive indicating a number of writes that can be performed within a service life of the respective storage drives;
   measuring, for each slice in the first storage tier, (i), a slice temperature that indicates a rate of IO (Input/Output) access to data on that slice and (ii) a slice write frequency that indicates a rate at which data is written to that slice;
   calculating (i) a maximum write rate of the first storage tier based on the write-endurance levels received from the set of storage drives in the first storage tier, (ii) a tier temperature of the first storage tier based on a sum of all slice temperatures for all slices in the first storage tier, and (iii) a tier write rate based on an average of all slice write frequencies for all slices in the first storage tier; and
   relocating slice data between storage tiers based on (i) the slice temperatures, (ii) the slice write frequencies, and (iii) the maximum write rate of the first storage tier,
   wherein relocating slice data between storage tiers increases the tier temperature of the first storage tier subject to (i) a first constraint that the tier write rate for the first storage tier does not exceed the maximum tier write rate of the first storage tier and (ii) a second constraint based on available computational resources.

2. The method of claim 1, wherein relocating slice data includes moving data from selected slices of the first storage tier to target slices that are not on the first storage tier.

3. The method of claim 1, wherein the method further comprises performing a precise tiering calculation that includes:
   computing a predicted tier temperature of the first storage tier for all possible configurations of slice contents located in the first storage tier; and
   selecting, from among all the possible configurations, a configuration that maximizes the tier temperature of the first storage tier; and
   wherein relocating slice data between storage tiers includes performing a tiering operation that implements the selected configuration.

4. The method of claim 3, further comprising:
   calculating the available computational resources in the data storage system;
   counting a total number of slices in the first storage tier;
   counting a total number of active slices across all storage tiers in the data storage system that store host-accessible data;
   calculating, based on the total number of slices in the first storage tier and the total number of active slices across all slices, required computational resources required to perform the precise tiering calculation within a predetermined time limit; and
   in response to the required computational resources being greater than the available computational resources, (i) performing an approximate tiering calculation that does not compute a tier temperature of the first storage tier for all possible configurations of slice contents and (ii) relocating slice data between storage tiers to increase the tier temperature of the first storage tier subject to a constraint that the tier write rate for the first storage tier does not exceed the maximum tier write rate of the first storage tier.

5. The method of claim 3, further comprising:
   counting a total number of slices in the first storage tier;
   counting a total number of active slices across all storage tiers in the data storage system that store host-accessible data;
   calculating a ratio of (i) the total number of slices in the first storage tier to (ii) the total number of active slices; and
   in response to the ratio exceeding a threshold, (i) performing an approximate tiering calculation that does not compute a tier temperature of the first storage tier for all possible configurations of slice contents and (ii) relocating slice data between storage tiers to increase the tier temperature of the first storage tier subject to a constraint that the tier write rate for the first storage tier does not exceed the maximum tier write rate of the first storage tier.

6. The method of claim 5, wherein the threshold is 0.5.

7. The method of claim 5,
   wherein the first storage tier includes multiple sub-tiers arranged by write endurance such that each sub-tier includes storage drives of like write endurance and storage drives in different sub-tiers have different write endurance,
   wherein each sub-tier has a respective maximum write rate based on write-endurance levels received from storage drives in that sub-tier, and
   wherein, when relocating slice data between storage tiers, the method further comprises moving slice data between sub-tiers based on (i) the slice write frequencies in the first storage tier, and (ii) the maximum write rates of the sub-tiers.

8. A data storage system, comprising control circuitry that includes a set of processing units coupled to memory, the control circuitry constructed and arranged to perform a method of storing data in a data storage system having multiple storage tiers, each storage tier composed of multiple storage drives of like performance, the method comprising:
   rendering storage space in each of the storage tiers as multiple slices, each slice providing an extent of contiguously addressable storage derived from a single storage tier;
   receiving write-endurance levels from a set of storage drives in a first storage tier, each write-endurance level from a storage drive indicating a number of writes that can be performed within a service life of the respective storage drive;
   calculating a maximum write rate of the first storage tier based on the write-endurance levels received from the set of storage drives in the first storage tier;

measuring, for each slice in the first storage tier, (i), a slice temperature that indicates a rate of IO (Input/Output) access to data on that slice and (ii) a slice write frequency that indicates a rate at which data is written to that slice; and relocating slice data between storage tiers based on (i) the slice temperatures, (ii) the slice write frequencies, and (iii) the maximum write rate of the first storage tier wherein the method further comprises:

calculating a tier temperature of the first storage tier based on a sum of all slice temperatures for all slices in the first storage tier; and calculating a tier write rate based on a sum of all slice write frequencies for all slices in the first storage tier, wherein relocating slice data between storage tiers increases the tier temperature of the first storage tier subject to (i) a first constraint that the tier write rate for the first storage tier does not exceed the maximum tier write rate of the first storage tier and (ii) a second constraint based on available computational resources.

9. The data storage system of claim 8, wherein the method further comprises performing a precise tiering calculation that includes:

computing a predicted tier temperature of the first storage tier for all possible configurations of slice contents located in the first storage tier; and selecting, from among all the possible configurations, a configuration that maximizes the tier temperature of the first storage tier; and wherein relocating slice data between storage tiers includes performing a tiering operation that implements the selected configuration.

10. The data storage system of claim 9, wherein the method further comprises:

calculating the available computational resources in the data storage system;

counting a total number of slices in the first storage tier;

counting a total number of active slices across all storage tiers in the data storage system that store host-accessible data;

calculating, based on the total number of slices in the first storage tier and the total number of active slices across all slices, required computational resources required to perform the precise tiering calculation within a predetermined time limit; and in response to the required computational resources being greater than the available computational resources, (i) performing an approximate tiering calculation that does not compute a tier temperature of the first storage tier for all possible configurations of slice contents and (ii) relocating slice data between storage tiers to increase the tier temperature of the first storage tier subject to a constraint that the tier write rate for the first storage tier does not exceed the maximum tier write rate of the first storage tier.

11. The data storage system method of claim 9, wherein the method further comprises:

counting a total number of slices in the first storage tier;

counting a total number of active slices across all storage tiers in the data storage system that store host-accessible data;

calculating a ratio of (i) the total number of slices in the first storage tier to (ii) the total number of active slices; and in response to the ratio exceeding a threshold, (i) performing an approximate tiering calculation that does not compute a tier temperature of the first storage tier for all possible configurations of slice contents and (ii) relocating slice data between storage tiers to increase the tier temperature of the first storage tier subject to a constraint that the tier write rate for the first storage tier does not exceed the maximum tier write rate of the first storage tier.

12. A computer program product including a set of non-transitory, computer-readable media having instructions which, when executed by control circuitry of a data storage system, cause the control circuitry to perform a method for storing host data, the method comprising:

rendering storage space in each of the storage tiers as multiple slices, each slice providing an extent of contiguously addressable storage derived from a single storage tier;

receiving write-endurance levels from a set of storage drives in a first storage tier, each write-endurance level from a storage drive indicating a number of writes that can be performed within a service life of the respective storage drive;

calculating a maximum write rate of the first storage tier based on the write-endurance levels received from the set of storage drives in the first storage tier;

measuring, for each slice in the first storage tier, (i), a slice temperature that indicates a rate of IO (Input/Output) access to data on that slice and (ii) a slice write frequency that indicates a rate at which data is written to that slice; and relocating slice data between storage tiers based on (i) the slice temperatures, (ii) the slice write frequencies, and (iii) the maximum write rate of the first storage tier, wherein the method further comprises:

calculating a tier temperature of the first storage tier based on a sum of all slice temperatures for all slices in the first storage tier; and calculating a tier write rate based on an average of all slice write frequencies for all slices in the first storage tier, wherein relocating slice data between storage tiers increases the tier temperature of the first storage tier subject to (i) a first constraint that the tier write rate for the first storage tier does not exceed the maximum tier write rate of the first storage tier and (ii) a second constraint based on available computational resources.

13. The computer program product of claim 12, wherein the method further comprises performing a precise tiering calculation that includes:

computing a predicted tier temperature of the first storage tier for all possible configurations of slice contents located in the first storage tier; and selecting, from among all the possible configurations, a configuration that maximizes the tier temperature of the first storage tier; and wherein relocating slice data between storage tiers includes performing a tiering operation that implements the selected configuration.

14. The computer program product of claim 13, wherein the method further comprises:

calculating the available computational resources in the data storage system;

counting a total number of slices in the first storage tier;

counting a total number of active slices across all storage tiers in the data storage system that store host-accessible data;

calculating, based on the total number of slices in the first storage tier and the total number of active slices across all slices, required computational resources required to perform the precise tiering calculation within a predetermined time limit; and in response to the required computational resources being greater than the available computational resources, (i) performing an approximate tiering calculation that does not compute a tier temperature of the first storage tier for all possible configurations of slice contents and (ii) relocating slice data between storage tiers to increase the tier temperature of the first storage tier subject to a constraint that the tier write rate for the first storage tier does not exceed the maximum tier write rate of the first storage tier.

15. The computer program product of claim 13, wherein the method further comprises:

counting a total number of slices in the first storage tier;

counting a total number of active slices across all storage tiers in the data storage system that store host-accessible data;

calculating a ratio of (i) the total number of slices in the first storage tier to (ii) the total number of active slices; and in response to the ratio exceeding a threshold, (i) performing an approximate tiering calculation that does not compute a tier temperature of the first storage tier for all possible configurations of slice contents and (ii) relocating slice data between storage tiers to increase the tier temperature of the first storage tier subject to a constraint that the tier write rate for the first storage tier does not exceed the maximum tier write rate of the first storage tier.

16. The computer program product of claim 15, wherein the threshold is 0.5.

17. The computer program product of claim 15, wherein the first storage tier includes multiple sub-tiers arranged by write endurance such that each sub-tier includes storage drives of like write endurance and storage drives in different sub-tiers have different write endurance, wherein each sub-tier has a respective maximum write rate based on write-endurance levels received from storage drives in that sub-tier, and wherein, when relocating slice data between storage tiers, the method further comprises moving slice data between sub-tiers based on (i) the slice write frequencies in the first storage tier, and (ii) the maximum write rates of the sub-tiers.

* * * * *